(12) United States Patent
Sung et al.

(10) Patent No.: US 6,977,554 B2
(45) Date of Patent: Dec. 20, 2005

(54) VARIABLE GAIN AMPLIFIER FOR HIGH FREQUENCY BAND USING MICROSTRIP HYBRID

(75) Inventors: Jin Bong Sung, Daejon-shi (KR); Sung Weon Kang, Daejon-shi (KR); Yun Tae Kim, Daejon-shi (KR)

(73) Assignee: Electronic and Telecommunications Research Institute (KR)

( * ) Notice: Subject to any disclaimer, the term of this patent is extended or adjusted under 35 U.S.C. 154(b) by 94 days.

(21) Appl. No.: 10/679,056

(22) Filed: Oct. 2, 2003

(65) Prior Publication Data

US 2004/0090271 A1 May 13, 2004

(30) Foreign Application Priority Data

Nov. 8, 2002 (KR) ................................ 10-2002-0069129

(51) Int. Cl.[7] .................................................. H03F 3/60
(52) U.S. Cl. ...................... 330/286; 330/51; 330/124 R
(58) Field of Search ....................... 330/286, 51, 124 R

(56) References Cited

U.S. PATENT DOCUMENTS

| | | | | |
|---|---|---|---|---|
| 5,289,193 A | * | 2/1994 | Lenormand et al. | 342/374 |
| 5,528,245 A | * | 6/1996 | Aker et al. | 342/104 |
| 6,211,729 B1 | | 4/2001 | Morkner et al. | |
| 6,531,935 B1 | * | 3/2003 | Russat et al. | 333/139 |
| 6,806,768 B2 | * | 10/2004 | Klaren et al. | 330/124 R |

FOREIGN PATENT DOCUMENTS

| | | |
|---|---|---|
| JP | 2000-106510 | 4/2000 |
| KR | 1020000060736 | 10/2000 |

* cited by examiner

*Primary Examiner*—Patricia Nguyen
(74) *Attorney, Agent, or Firm*—Blakely Sokoloff Taylor & Zafman

(57) ABSTRACT

The present invention relates to a variable gain amplifier for a high frequency band, and comprises a divider for dividing a input signal; a fixed variable gain amplifier for amplifying an output signal of the divider; a microstrip ring hybrid for outputting a plurality of signals which have the same or different phases, wherein the microstrip ring hybrid comprises a plurality of input terminals and output terminals having a constant impedance; a switch for selectively inputting an output of the variable gain amplifier to any one of the input terminals of the microstrip ring hybrid; a transmission line for delaying the output signal of the divider; and a combiner for combining each of the output signals of the microstrip ring hybrid and a signal passing through the transmission line and outputting the combined signal, wherein the output power is controlled by selectively inputting the output of the variable gain amplifier to any one of the input terminals of the microstrip ring hybrid by means of the switches, so that its input-output matching may be obtained irrespective of its gain.

5 Claims, 1 Drawing Sheet

VARIABLE GAIN AMPLIFIER FOR HIGH FREQUENCY BAND USING MICROSTRIP HYBRID

BACKGROUND OF THE INVENTION

1. Field of the Invention

The present invention relates to a variable gain amplifier for a high frequency band, and more specifically, to a variable gain amplifier for a high frequency band using a microstrip ring hybrid so that the constant matching conditions in input and output may be obtained irrespective of its gain.

2. Description of the Prior Art

Generally, a conventional variable gain amplifier is able to control its gain by converting transmission paths of signals with a switch or by controlling a bias current or voltage of the amplifier.

FIG. 1 is a circuit diagram illustrating a conventional variable gain amplifier with a switch. The conventional variable gain amplifier comprises a fixed variable gain amplifier 101 and a switch 102 which is connected between a input terminal IN and an output terminal OUT of the fixed variable gain amplifier 101.

When the switch is turned OFF, the input IN and the output OUT are disconnected, so that high output power can be obtained by operation of the fixed variable gain amplifier 101. When the switch is turned ON, the input IN and the output OUT are connected, so that low output power can be obtained.

In the conventional variable gain amplifier described above, the low and high output powers can be obtained in accordance with change of the impedance of the amplifier associated with the switch being turned ON and OFF. Most of the variable gain amplifiers obtain high output power with the switch being turned OFF. However, in order to obtain low output power of the variable gain amplifier when the switch is turned ON, the gain of the variable gain amplifier may be lowered due to the resistance of the switch itself. Therefore, it is a problem that good condition of impedance matching can not be obtained with the conventional variable gain amplifiers.

SUMMARY OF THE INVENTION

A object of the present invention is to provide a variable gain amplifier in which the output of amplifier to the microstrip ring hybrid having a constant impedance irrespective of its output power, thereby controlling its gain and thus solving the aforementioned problems.

In order to accomplish the above object, a variable gain amplifier for a high frequency band according to the present invention is characterized to comprise a divider for dividing a input signal; a fixed variable gain amplifier for amplifying an output signal of the divider; a microstrip ring hybrid for outputting a plurality of signals which have the same or different phases, wherein the microstrip ring hybrid comprises a plurality of input terminals and output terminals having a constant impedance; a switch for selectively inputting an output of the variable gain amplifier to any one of the input terminals of the microstrip ring hybrid; a transmission line for delaying the output signal of the divider; and a combiner for combining each of the output signals of the microstrip ring hybrid and a signal passing through the transmission line and outputting the combined signal, wherein the output power is controlled by selectively inputting the output of the variable gain amplifier to any one of the input terminals of the microstrip ring hybrid by means of the switches.

In addition, a microstrip ring hybrid according to the present invention is characterized in that the impedance $Z_0$ is 50 Ω, the impedance of the inner diameter line is $2 Z_0$, and the distance between terminals is $\lambda/4$ or $3\lambda/4$.

In addition, a microstrip ring hybrid according to the present invention is characterized in that the number of each of the input and output terminals of the microstrip ring hybrid is two and the length of the transmission line is $\lambda/4$ or $3\lambda/4$.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

A microstrip ring hybrid has two input ports through which two signals are input and output ports which output the components of addition and difference of the two input signals. The microstrip ring hybrid has mainly been adapted to a frequency combiner, an amplifier or a high frequency band circuit.

When the microstrip ring hybrid is designed to have inner diameter line, of which impedance is $\sqrt{2} Z_0$ and to have distances between terminals which are $\lambda/4$ and $3\lambda/4$, the impedances at the terminals are equal to $Z_0$, where the $Z_0$ is a characteristic impedance of wave propagation and about 50 Ω.

By using input-output matching characteristics of the microstrip ring hybrid according to the present invention, it is possible to obtain good input-output standing wave ratio irrespective of the output power. Therefore, it is possible to implement a variable gain amplifier having constant input and output matching characteristics irrespective of the gain.

Now, the preferred embodiments of the present invention will be described in details with reference to the accompanying drawings.

Figure 1:
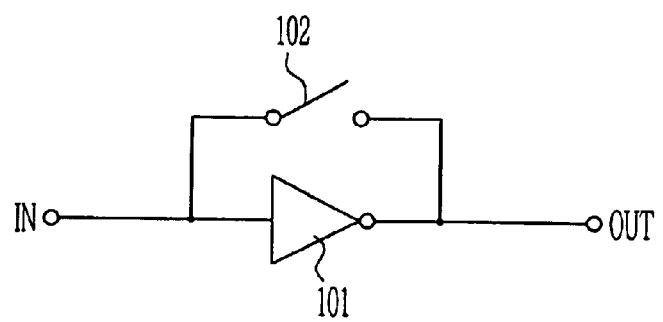
FIG. 1 is a circuit diagram illustrating a conventional high frequency band variable gain amplifier with a switch.
Figure 2:
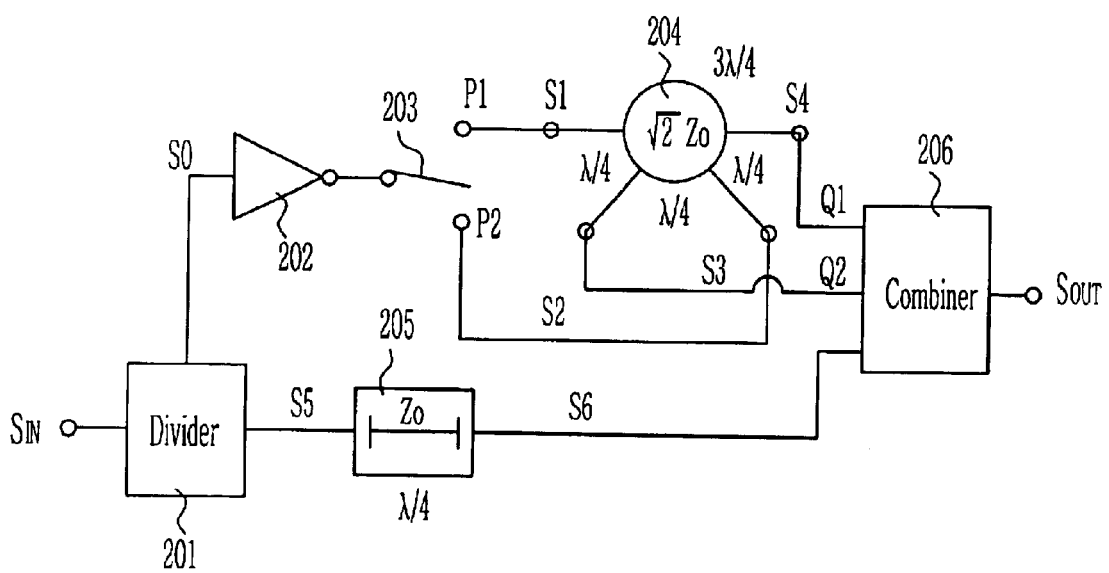
FIG. 2 is a circuit diagram illustrating a variable gain amplifier according to the present invention.

FIG. 2 is a circuit diagram illustrating a variable gain amplifier according to the present invention.

An input signal $S_{IN}$ is divided into two signals; a signal S0 and a signal S5. When the signal S0 is input to a fixed variable gain amplifier 202, the signal S0 is amplified by the fixed variable gain amplifier 202. Passing through a transmission line 205, the signal S5 is delayed by the transmission line 205 for a predetermined time.

The output of the fixed variable gain amplifier 202 is transferred to one of input terminals P1, P2 of a microstrip ring hybrid 204 with the operation of a switch 203. When the microstrip ring hybrid 204 receives the output of the fixed variable gain amplifier 202, the microstrip ring hybrid 204 converts the output of the fixed variable gain amplifier 202 to two signals having the same amplitudes and the opposite phases (or two signals having the same amplitudes and the same phases) through two output terminals Q1 or Q2.

Each of the signals from the output terminals Q1 and Q2 of the microstrip ring hybrid 204 and the delayed signal which passes through the transmission line 206 are combined at the combiner 206. The combined signal is output through output terminal $S_{OUT}$ of the combiner 206.

Now, the operation of the variable gain amplifier according to the present invention will be described in details with reference to Tables 1 and 2 described below.

Table 1 shows a signal component in low power characteristics.

The input signal $S_{IN}$ is divided by the divider 201 into two signals S0 and S5 which have amplitudes of $V/\sqrt{2}$ and phases of $\phi$.

When the signal S0 is input to the fixed variable gain amplifier 202, the signal S0 is amplified by the variable gain amplifier 202, and then, is transferred to one of input terminal P1, P2 of the microstrip ring hybrid 204 with the operation of the switch 203. When the signal S1 having the amplitude of $GV/\sqrt{2}$ and the phase of $\phi$ due to the amplification of the fixed gain amplifier 202 is input to the input terminal P1, the signal S4 having the amplitude of $GV/2$ and the phase of $\phi-90°$ and the signal S3 having the amplitude of $GV/2$ and the phase of $\phi+90°$ are output from the output terminals Q1, Q2 of the microstrip ring hybrid 204, respectively. In other words, when the signal S1 having the amplitude of $GV/\sqrt{2}$ and the phase of $\phi$ is input to the input terminal P1 and the signal S2 is not input to the input terminal P2, the signals S3 and S4 output from the output terminals Q1 and Q2, respectively, of the microstrip ring hybrid 204 have the same amplitudes and the phase difference of 180°.

After that, the output signals S3, S4 of the microstrip ring hybrid 204 and the signal S6 having the amplitudes of $V/\sqrt{2}$ and the phases of $\phi 90°$ delayed through the $V/\sqrt{2}$ transmission line 205 are input to the combiner 206. The combiner 206 combines the signals S3, S4, and S6 to output a signal having the amplitude of $V/\sqrt{2}$ and the phase of N/A at the output terminal $S_{out}$, where N/A denote a phase which is determined in accordance with the characteristics of the combiner. In other words, the signal of the output terminal $S_{out}$ has a low output power characteristics having a gain of −3 dB.

TABLE 1

| Signal | Voltage | Phase (°) |
|---|---|---|
| $S_{IN}$ | V | N/A |
| S0 | $V/\sqrt{2}$ | $\phi$ |
| S1 | $GV/\sqrt{2}$ | $\phi$ |
| S2 | 0 | N/A |
| S3 | $GV/2$ | $\phi + 90°$ |
| S4 | $GV/2$ | $\phi - 90°$ |
| S5 | $V/\sqrt{2}$ | $\phi$ |
| S6 | $V/\sqrt{2}$ | $\phi + 90°$ |
| $S_{out}$ | $V/\sqrt{2}$ | N/A |

Table 2 shows a signal component in high power characteristics.

The input signal $S_{IN}$ is divided by the divider 201 into two signals S0 and S5 which have amplitudes of $V/\sqrt{2}$ and phases of $\phi$.

When the signal S0 is input to the fixed variable gain amplifier 202, the signal S0 is amplified by the variable gain amplifier 202, and transferred to one of input terminal P1, P2 of the microstrip ring hybrid 204 with the operation of the switch 203. When the signal S2 having the amplitude of $GV/\sqrt{2}$ and the phase of $\phi$ due to the amplification of the fixed gain amplifier 202 is input to the input terminal P2, the signals S4 and S3 having the amplitude of $GV/2$ and the phase of $\phi+90°$ are output from the output terminals Q1, Q2 of the microstrip ring hybrid 204. In other words, when the signal S2 having the amplitude of $GV/\sqrt{2}$ and the phase of $\phi$ is input to the input terminal P1 and the signal S2 is not input to the input terminal P2, the signals S3 and S4 output from the output terminals Q1 and Q2, respectively, of the microstrip ring hybrid 204 have the same amplitudes and the same phases.

After that, the output signals S3, S4 of the microstrip ring hybrid 204 and the signal S6 having the amplitudes of $V/\sqrt{2}$ and the phases of $\phi 90°$ delayed through the $/4$ transmission line 205 are input to the combiner 206. The combiner 206 combines the signals S3, S4, and S6 to output a signal having the amplitude of $V/\sqrt{2}$ +GV and the phase of N/A at the output terminal $S_{out}$, where N/A denote a phase which is determined in accordance with the characteristics of the combiner. In other words, the signal of the output terminal $S_{out}$ has a high output power characteristics.

TABLE 2

| Signal | Voltage | Phase (°) |
|---|---|---|
| $S_{IN}$ | V | N/A |
| S0 | $V/\sqrt{2}$ | $\phi$ |
| S1 | 0 | N/A |
| S2 | $GV/\sqrt{2}$ | $\phi$ |
| S3 | $GV/2$ | $\phi + 90°$ |
| S4 | $GV/2$ | $\phi + 90°$ |
| S5 | $V/\sqrt{2}$ | $\phi$ |
| S6 | $V/\sqrt{2}$ | $\phi + 90°$ |
| $S_{out}$ | $V/\sqrt{2}$ + GV | N/A |

As shown in Tables 1 and 2, when the microstrip ring hybrid is designed to have inner diameter line, of which impedance is $\sqrt{2}Z_0$ and to have distances between terminals of $\lambda/4$ and $3\lambda/4$, the impedances at the terminals are equal to $Z_0$. Both output terminals Q1 and Q2 of the microstrip ring hybrid have the same impedance of $Z_0$, even though a signal is applied to any one of the two input terminals P1 and P2 of the microstrip ring hybrid. In addition, the impedances of the input and output of the transmission line 205 are equal to $Z_0$. Therefore, in the variable gain amplifier according to the present invention, there are no changes of the three input impedances and the output impedance of the combiner 206. And also, the input and output standing wave ratio can be kept constant.

As described above, according to the present invention, the gain is able to controlled by selectively inputting signals into the microstrip ring hybrid having constant impedance irrespective of the magnitude of the output power by using the switches. Therefore, it is possible to keep impedance matching of input and output good irrespective of the magnitude of the output power. As a result, it is possible to easily implement a frequency mixer, an amplifier, and a high frequency band circuit, etc., having good operational characteristics by using the variable gain amplifier.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A variable gain amplifier, comprising:

a divider for dividing a input signal;

a fixed variable gain amplifier for amplifying an output signal of the divider;

a microstrip ring hybrid for outputting a plurality of signals which have the same or different phases, the microstrip ring hybrid comprising a plurality of input terminals and output terminals having a constant impedance;

a switch for selectively inputting an output of the variable gain amplifier to any one of the input terminals of the microstrip ring hybrid;

a transmission line for delaying the output signal of the divider; and a combiner for combining each of the output signals of the microstrip ring hybrid and a signal passing through the transmission line and outputting the combined signal, wherein the output power is controlled by selectively inputting the output of the variable gain amplifier to any one of the input terminals of the microstrip ring hybrid by means of the switches.

2. A variable gain amplifier according to claim 1, wherein an impedance of an inner diameter line and the distances between the terminals of the microstrip ring hybrid is controlled, thereby each of the terminals having an impedance $Z_0$.

3. A variable gain amplifier according to claim 1, wherein the impedance $Z_0$ is 50Ω, wherein the impedance of the inner diameter line is $\sqrt{2}\ Z_0$, and wherein the distance between terminals is $\lambda/4$ or $3\lambda/4$.

4. A variable gain amplifier according to claim 1, wherein the number of each of the input and output terminals of the microstrip ring hybrid is two.

5. A variable gain amplifier according to claim 1, wherein the length of the transmission line is $\lambda/4$ or $3\lambda/4$.

* * * * *